(12) United States Patent
Goto et al.

(10) Patent No.: US 7,030,698 B2
(45) Date of Patent: Apr. 18, 2006

(54) HIGH-FREQUENCY POWER AMPLIFIER

(75) Inventors: Seiki Goto, Tokyo (JP); Yoshinobu Sasaki, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 86 days.

(21) Appl. No.: 10/819,207

(22) Filed: Apr. 7, 2004

(65) Prior Publication Data
US 2004/0222854 A1 Nov. 11, 2004

(30) Foreign Application Priority Data
May 8, 2003 (JP) ............................. 2003-130178

(51) Int. Cl.
*H03F 3/68* (2006.01)
(52) U.S. Cl. ...................... 330/295; 330/307
(58) Field of Classification Search ............. 330/286, 330/295, 307
See application file for complete search history.

(56) References Cited

U.S. PATENT DOCUMENTS 5,111,157 A * 5/1992 Komiak .................. 330/286
5,659,267 A * 8/1997 Buer et al. ............... 330/277
5,805,023 A 9/1998 Fukuden

FOREIGN PATENT DOCUMENTS

| JP | 63-127575 | 5/1988 |
|----|-----------|--------|
| JP | 2-110943 | 4/1990 |
| JP | 06-069737 | 3/1994 |
| JP | 8-130419 | 5/1996 |
| JP | 2001-274415 | 10/2001 |

OTHER PUBLICATIONS

Walker, John L..B.; "High-Power GaAs FET Amplifiers", *Artech House, Inc.*, pp. 87-93, (1993).

* cited by examiner

*Primary Examiner*—Steven J. Mottola
(74) *Attorney, Agent, or Firm*—Leydig, Voit & Mayer, Ltd.

(57) ABSTRACT

In a high-frequency power amplifier, gate feed portions are formed by dividing a gate feed which connects transistor gate electrodes in parallel, and each of the gate feed portions includes a given number of gate electrodes connected in parallel. Each of transistor cell elements includes a set of the gate electrodes connected in parallel. A resistance wire is interposed between the transistor cell elements to isolate each transistor cell element. The resistance wire and the gate electrodes are made of the same metal material and formed by the same process. Thus, closed loop oscillation of transistors is suppressed with no increase in chip size.

9 Claims, 10 Drawing Sheets

HIGH-FREQUENCY POWER AMPLIFIER

BACKGROUND OF THE INVENTION

1. Field of the Invention

The invention relates to a high-frequency power amplifier using amplifier elements such as field-effect transistors or bipolar transistors, and particularly to a high-frequency power amplifier for use in communication devices that process signals in a high-frequency band such as a microwave band and a millimeter wave band for mobile communication or satellite communication.

2. Description of the Related Art

In recent years, proposed are a variety of high-performance amplifier devices, such as high electron mobility transistors (HEMTs) and heterojunction bipolar transistors (HBTs), which can amplify high-frequency signals such as those in a microwave band. Such microwave amplifiers are incorporated into a variety of communication devices, such as portable telephones, in which received micro signals are amplified to have a desired power by the amplifiers.

In the conventional microwave amplifier comprising the high-performance transistors, specifically using a negative-feedback circuit connected to a source of a field-effect transistor (hereinafter, also referred to as FET), however, parasitic oscillation can be generated at a high frequency several times as high as the desired frequency for amplification. Even when normal transistors are used, such parasitic oscillation can occur. Existence of such parasitic oscillation frequency can be fatal for the amplifier, and therefore, the amplifier should be designed to be free from such parasitic oscillation.

For example, a non-patent literature 1 as listed below discloses a high-frequency power amplifier having a large number of transistors having an interdigital electrode structure for high power amplification.

Non-patent literature 1: "High-Power GaAs FET Amplifiers," John L. B. Walker, Editor, 1993, Artech House, Inc., FIG. 2.16, Typical pattern layout of an interdigital FET and key dimensions.

FIG. 9 shows a main structure thereof, and FIG. 10 provides an equivalent circuit diagram thereof. Referring to FIGS. 9 and 10, the conventional structure includes a large number of transistors (such as FETs) connected in parallel for high power. In FIGS. 9 and 10 showing such a structure, reference numeral 10 represents a transistor per one finger, 11 a gate feed, 12 a gate RF pad, 13 a drain pad, 14 a gate finger (a gate electrode), 15 a drain electrode, 16 a source electrode, 17 a gate lead electrode, and 21 a source pad for grounding).

In such a conventional structure, a large number of transistors 10 having an interdigital electrode structure are connected in parallel, and all gate fingers 14 are directly connected in parallel to the gate feed 11 by a lead. In such a conventional structure, a large number of closed loops can be formed between the transistors connected in parallel, and such closed loops can cause parasitic oscillation to be a problem. The conventional structure as shown in the drawings has no means for suppressing the closed loop oscillation, which is generated between the transistor fingers. In case the parasitic oscillation is generated, conventionally, an external circuit such as a resister (not shown) should be added outside the amplifier in order to suppress the parasitic oscillation.

In the conventional high-power amplifier with the interdigital electrode structure as shown in FIG. 9, a large number of transistors are connected in parallel, and the gate fingers 14 are connected to the gate feed 11 to be arranged in a single row in a linear form. Therefore, a large number of closed loops can be formed between the transistor gate fingers, and such closed loops can cause parasitic oscillation closed loop oscillation). The conventional amplifier has no means for suppressing such closed loop oscillation. In consideration of occurrence of the closed loop oscillation, a external circuit (not shown) for stabilization should be added outside the transistor-forming chip in order to suppress the parasitic oscillation. Such an external circuit should form a resistance element for isolation (element isolation), which should be connected in parallel between the gate fingers.

A stabilizing circuit such as a resistance element can be formed together with the transistors in a single chip. Conventionally, however, an extra process is needed to form such a resistance element, and an extra space is needed to hold the additional resistance element or the like, so that an area of the chip can be increased.

SUMMARY OF THE INVENTION

The invention has been made to solve the above problems. It is therefore an object of the invention to suppress closed loop oscillation by providing a parallel resistor circuit which can be formed in a transistor chip, with no conventional external circuit for suppressing the oscillation.

It is another object of the invention to provide a transistor assembly having an improved gate finger structure and the resistor circuit, in which the gate fingers (gate electrodes) and the resistor circuit are made of the same material and formed by the same process to thereby realize a high-frequency power amplifier in which the closed loop oscillation can be suppressed by simple means with no increase in the size of the chip having a large number of transistors.

In order to achieve the above objects, a high-frequency power amplifier according to the present invention has a plurality of transistors connected in parallel with gate electrodes, drain electrodes and source electrodes arranged in parallel and in an interdigital form. The high-frequency power amplifier includes: a gate power supply portion connecting a plurality of the gate electrodes in parallel; and a plurality of gate power supply segments formed by dividing the gate power supply portion. Each gate power supply segment has a set of a given number of the gate electrodes connected in parallel. The high-frequency power amplifier further includes: transistor cell elements each having the set of the given number of the gate electrodes connected in parallel by each gate power supply segment; and a resistance wire which is interposed between the transistor cell elements to connect the transistor cell elements.

Thus, the resistance wire, which is interposed between the transistor cell elements each having a set of a given number of transistor gate electrodes, can suppress odd mode oscillation between the transistors which operates in parallel.

BRIEF DESCRIPTION OF THE DRAWINGS

These and other objects and features of the present invention will be readily understood from the following detailed description taken in conjunction with preferred embodiments thereof with reference to the accompanying drawings, in which like parts are designated by like reference numerals and in which.

DETAILED DESCRIPTION OF THE PREFERRED EMBODIMENTS

Figure 1:
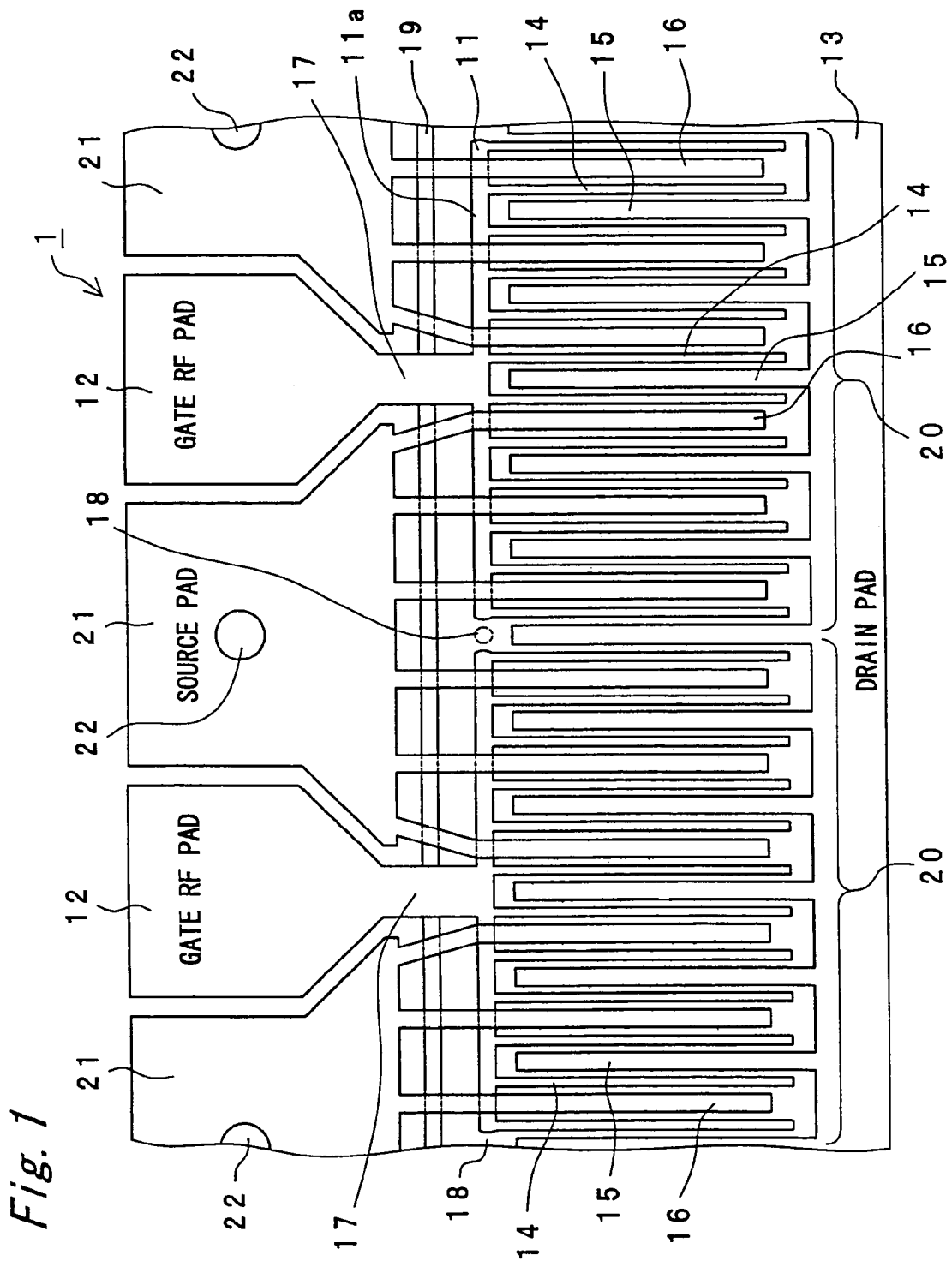
FIG. 1 is a diagram showing a main structure of a high-frequency amplifier having a transistor assembly with an interdigital electrode structure according to First Embodiment of the invention.

Referring to FIGS. 1 to 8, described are embodiments of the inventive high-frequency power amplifier formed on an IC chip which includes a large number of transistors connected in parallel, having an interdigital electrode structure for high-frequency power amplification. In the illustrated embodiments, active elements for amplification are field-effect transistors (FET). However, the invention is not limited to the FET amplifier. For example, a bipolar transistor may similarly be used as the active element for amplification in place of FET. In the drawings showing the embodiments, common elements are represented by the same reference numeral, and duplication of description will be avoided.

First Embodiment

Figure 2:
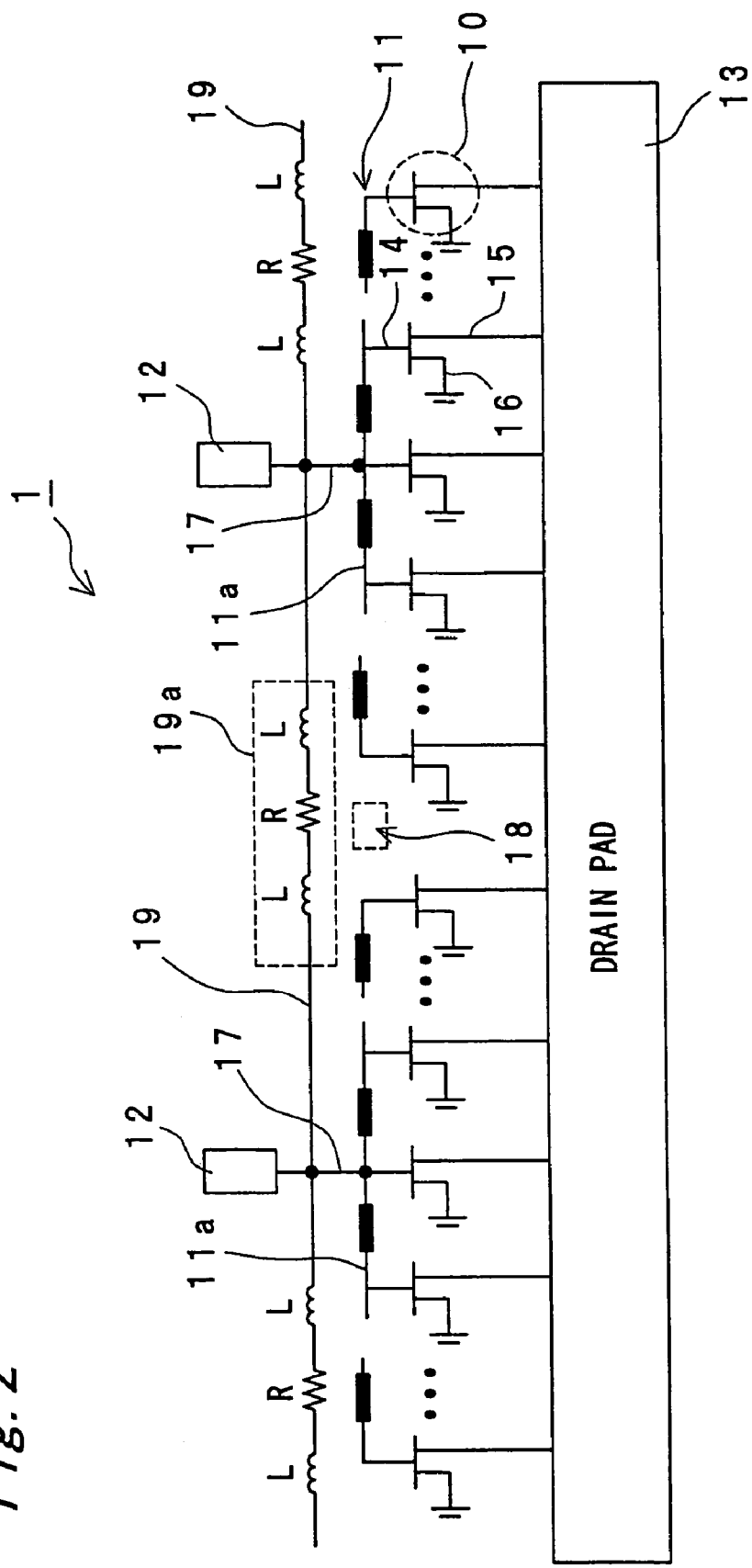
FIG. 2 is a diagram showing an equivalent circuit of the main structure as shown in FIG. 1.

Referring to FIGS. 1 and 2, First Embodiment of the invention is described below. FIG. 1 is a diagram showing a main structure of First Embodiment of the inventive high-frequency power amplifier in which a large number of field-effect transistors (FETs) are assembled by connection to have an interdigital electrode structure. FIG. 2 is a diagram showing an equivalent circuit of the transistor assembly as shown in FIG. 1.

In the structure as shown in FIGS. 1 and 2, reference numeral 10 represents a transistor per one finger, 11 a gate feed, 12 a gate RF pad, 13 a drain RF pad, 14 a gate finger (a gate electrode), 15 a drain electrode, and 16 a source electrode. Reference numeral 17 represents a gate lead electrode, which extends from the gate RF pad 12 and connects the gate feed 11 to the gate RF pad 12. Reference numeral 18 represents a boundary portion (a spacing portion) by which the gate feed 11 is divided into portions each with a constant length. Reference numeral 19 represents a resistance wire, which is connected to the gate lead electrode 17. The resistance wire 19 and the gate fingers 14 are made of the same material and formed by the same process. Reference numeral 20 represents a transistor cell including a set of a given number of gate fingers. Reference numeral 21 represents a source pad (for grounding) which is placed outside the active layer region. A via hole 22 is formed in each source pad 21 (for grounding) so that a given number of source electrodes are grounded together.

In this embodiment, the gate feed 11 is divided into a plurality of gate feed portions 11a each with a constant length, and each gate feed portion 11a has a set of a given number of gate fingers 14 which are connected in parallel and arranged in an interdigital form. Each gate feed portion 11a is connected to the gate RF pad 12 via the gate lead electrode 17 which is positioned at a center portion thereof.

In this configuration, the resistance wire 19 extends over the transistor cells 20 to connect them each having a set of a given number of gate fingers per each gate feed portion 11a. The resistance wire 19 is provided as an isolation resistor circuit for isolating each gate feed portion 11a. In this embodiment, an isolation resistor circuit 19a is linked between the gate lead electrodes 17 of the transistors. In such a structure, the resistance wire 19 formed as a resistor circuit for isolation can suppress the closed loop oscillation, which would otherwise be generated between a large number of transistor fingers connected in parallel via the gate feed 11.

Each divided gate feed portion 11a forms a transistor cell element 20 including a given number of the gate fingers 14. The resistive element (R,L) of the resistance wire 19 forms an isolation resistor circuit 19a, which intervenes between the transistor cell elements 20 and connects the adjacent transistor cell elements 20. Each resistor circuit 19a can be represented by an equivalent circuit comprising two inductances L and one resistor R. In this embodiment, the gate feed 11 has an improvement of a conventional structure, in which the resistive element is added to form a stabilizing circuit. The resistive element and the transistors of the amplifier are formed in a single chip. Therefore, the chip size of the stabilizing circuit-added amplifier of this embodiment can be as small as that of the conventional transistor assembly.

In the transistor assembly of the high-frequency amplifier 1 according to this embodiment, the parallel resistor circuit 19a is interposed between the units each with a given number of transistor gate fingers, so that odd mode oscillation can be suppressed between a plurality of the transistors operating in parallel.

Figure 3:
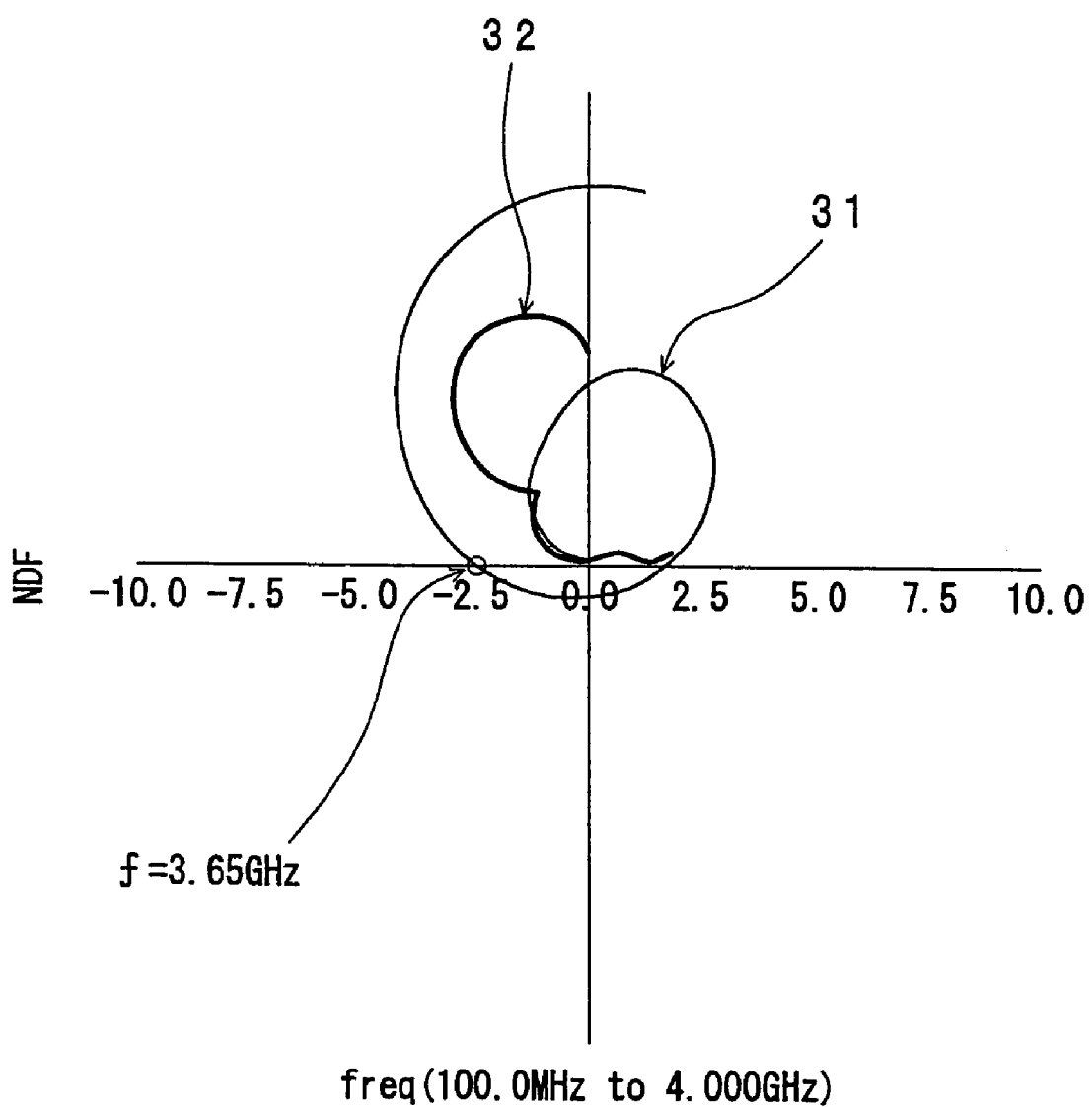
FIG. 3 is a graph showing a comparison result of a simulation using the Nyquist's criterion.
Figure 9:
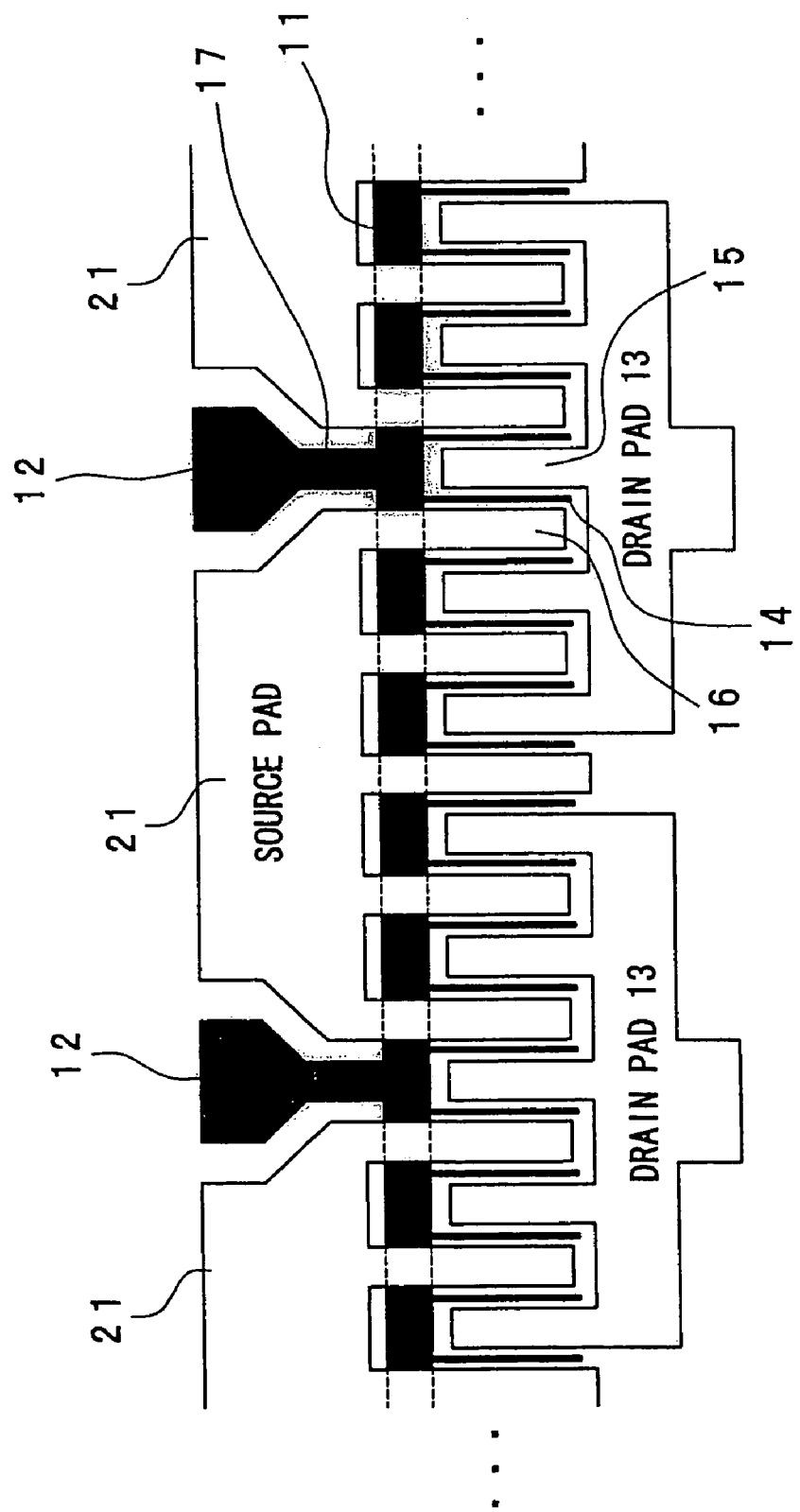
FIG. 9 is a diagram showing a main structure of a conventional high-frequency amplifier having a transistor assembly with an interdigital electrode structure.
Figure 10:
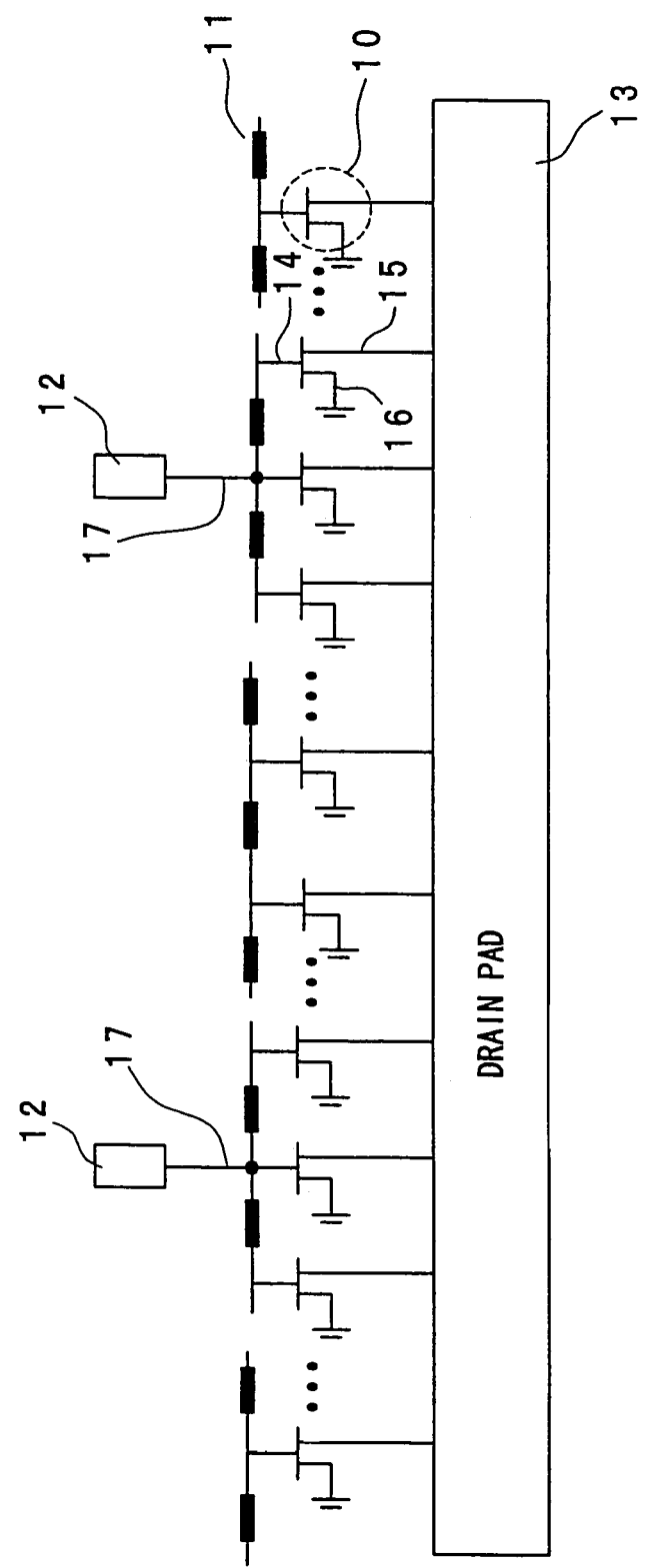
FIG. 10 is a diagram showing an equivalent circuit of the main structure as shown in FIG. 9.

A simulation using the Nyquist's criterion was performed to determine whether the odd mode oscillation would be generated or not for comparing between the transistor assembly with the conventional structure as shown in FIG. 9 and the transistor assembly of First Embodiment as shown in FIG. 1. FIG. 3 shows the result of the simulation and comparison. In the simulation, calculation was performed based on the equivalent circuits as shown in FIGS. 2 and 10.

For the Nyquist's criterion, return differences of the transistors were plotted on a polar coordinate system, and whether the oscillation would be generated or not was determined by whether the plot intersects with the negative real axis. In FIG. 3, a narrow line 31 represents the return differences of the conventional transistor assembly, and a wide line 32 represents the return differences of the transistor assembly of the present embodiment.

The transistor assembly with the conventional structure satisfies the conditions for the oscillation at a frequency of 3.65 GHz (f=3.65 GHz). In contrast, the plot of the return differences of the transistor assembly of this embodiment has no point of intersection with the negative real axis, and it was confirmed by the result of the calculation that no oscillation would be generated.

In this embodiment, no external circuit for suppressing oscillation is provided for the transistor chip. In this embodiment, a resistor circuit is provided in the amplifier to suppress the closed loop oscillation, and the resistor circuit is interposed to connect the gate feed portions in the transistor assembly. In this embodiment, the resistor circuit and the gate electrodes are made of the same material and formed by the same process. Thus, the closed loop oscillation can be suppressed in a simple transistor assembly with no increase in chip size.

Second Embodiment

Figure 4:
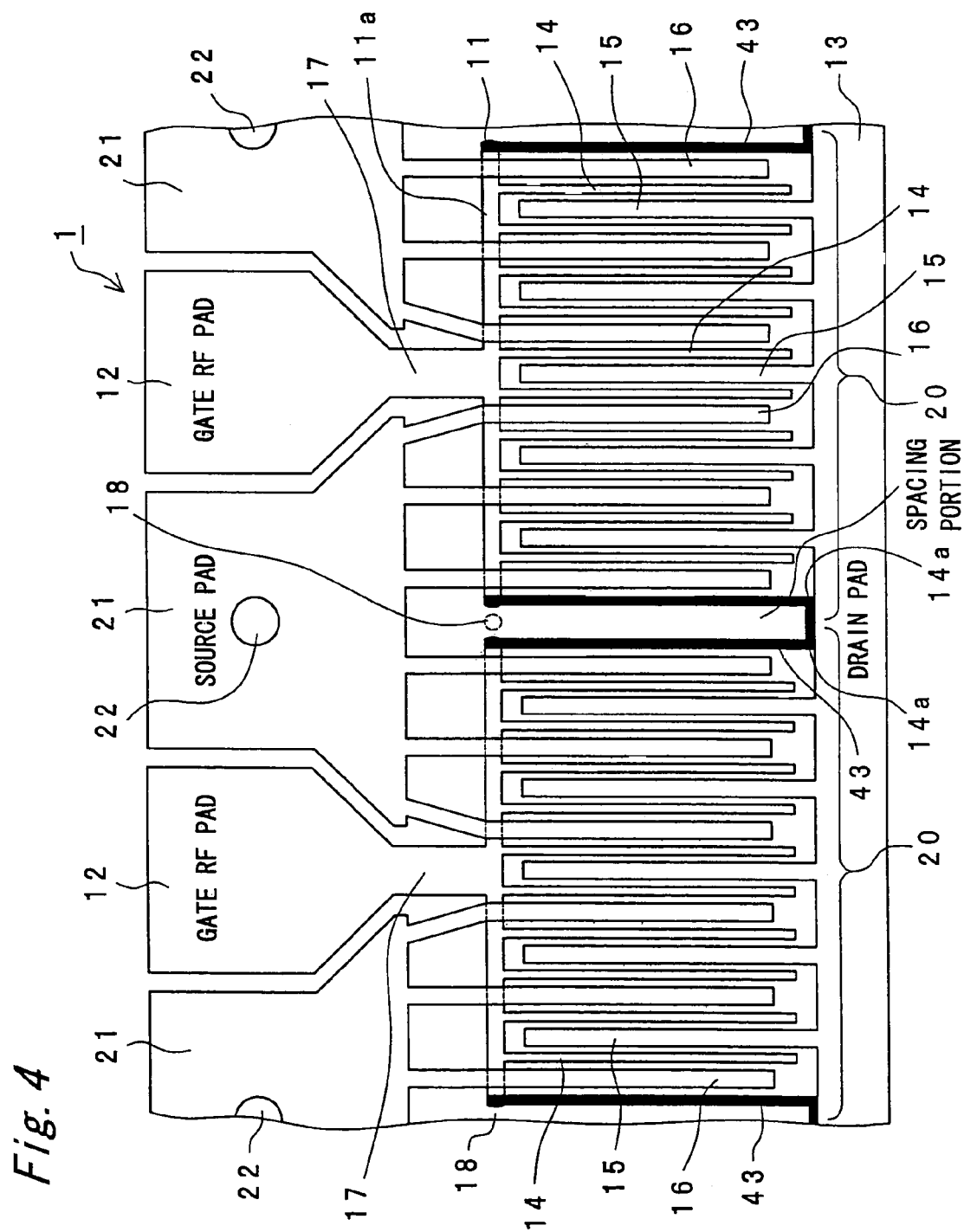
FIG. 4 is a diagram showing a main structure of a high-frequency amplifier having a transistor assembly with an interdigital electrode structure according to Second Embodiment of the invention.

Referring to FIG. 4, Second Embodiment of the invention is described below. FIG. 4 shows a schematic configuration of a field-effect transistor (FET) assembly 1 with an interdigital electrode structure according to Second Embodiment. The main structure thereof is the same as that of First Embodiment. Second Embodiment differs from First Embodiment in that in place of the resistance wire 19, resistance wires 43 are provided to connect the divided gate feed portions 11a.

Referring to FIG. 4, the gate feed 11 is divided into portions each with a constant length, and in the semiconductor region of the spacing portion at each boundary portion 18, a pair of resistance wires 43 are arranged in parallel to each gate finger 14 and connected to each other at the lower end 14a, and the upper ends of the resistance wires 43 are connected to opposite ends of the adjacent gate feed portions 11a, respectively. Thus, the adjacent gate feed portions 11a are connected to each other via the resistance wires 43, which function as an isolation resistor.

Referring to FIG. 4, if a drain electrode (or a source electrode) is provided in the spacing portion between the pair of opposite resistance wires 43, the resistance wires 43 connected to each other at the bottom end 14a can function as not only an isolation resistor but also a gate electrode (finger).

The value of resistance can easily be changed by modifying the length of each resistance wire 43. In this embodiment, the resistance wires 43 and the gate fingers (or gate electrodes) 14 are made of the same material and formed by the same process, similarly to the resistance wire 19 of First Embodiment.

In the transistor assembly 1 of this embodiment, the resistance wires 43 provided in parallel to each gate finger form an isolation resistor between the divided gate feed portions 11a. Thus, the wires 43 can suppress the closed loop oscillation, which would otherwise be generated between a large number of transistor fingers connected in parallel. The wires 43 can suppress the odd mode oscillation between the transistors operating in parallel. The resistance wires provided as a circuit element of the amplifier do not increase the size of the chip.

Third Embodiment

Figure 5:
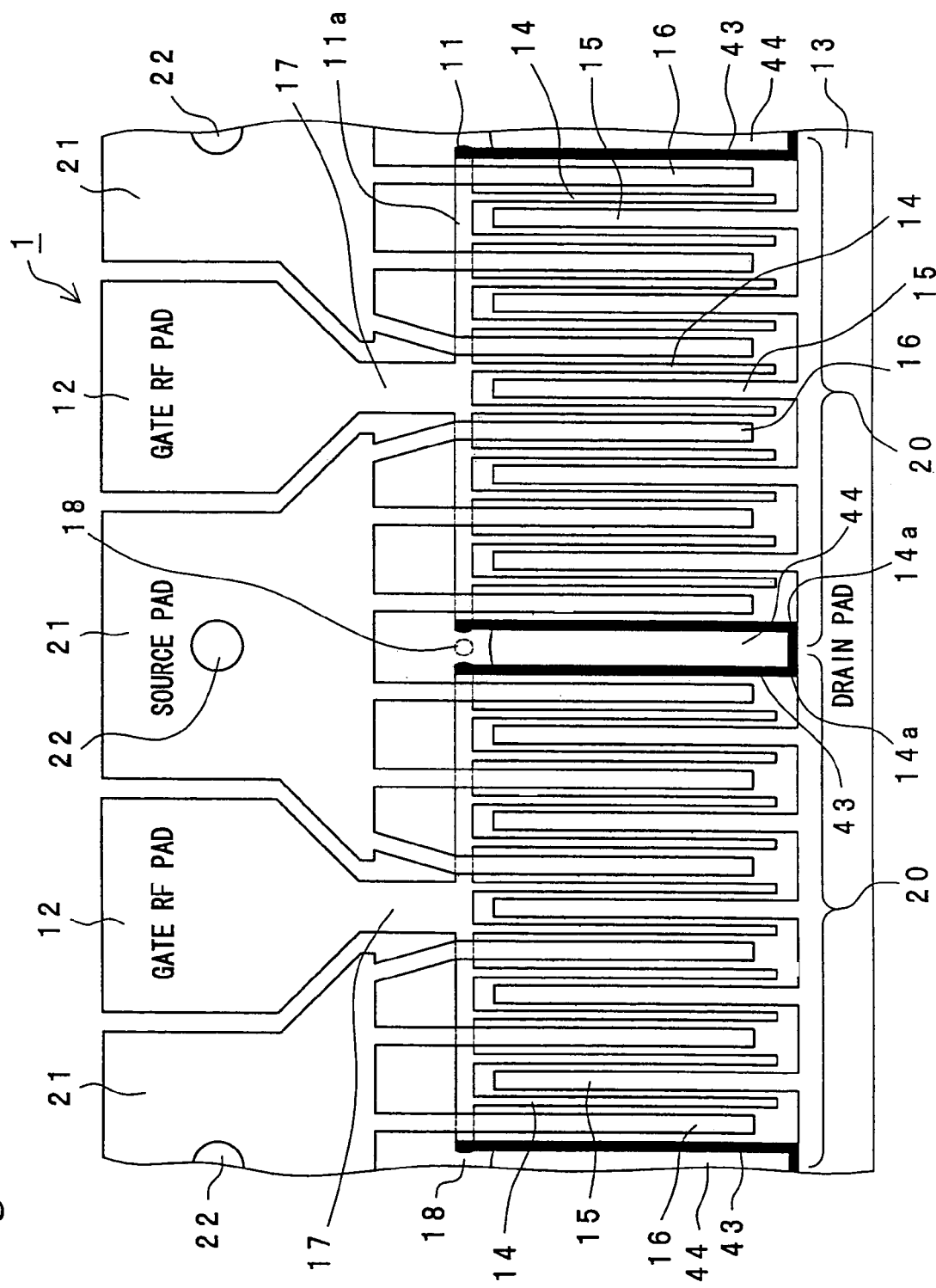
FIG. 5 is a diagram showing a main structure of a high-frequency amplifier having a transistor assembly with an interdigital electrode structure according to Third Embodiment of the invention.
Figure 6:
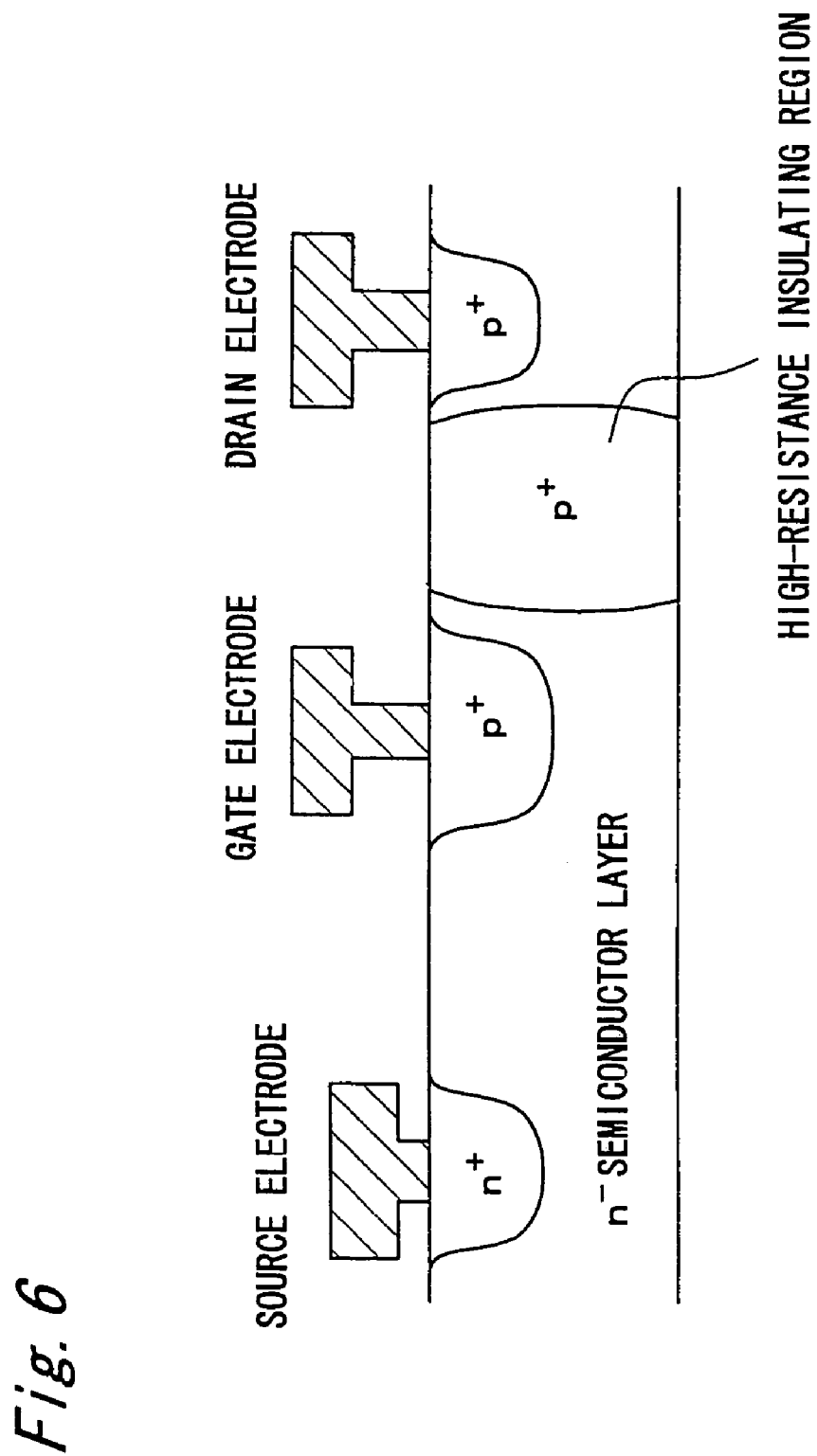
FIG. 6 is a diagram showing a sectional structure of the main portion as shown in FIG. 5.

Referring to FIGS. 5 and 6, Third Embodiment of the invention is described below. FIG. 5 shows a schematic configuration of a field-effect transistor (FET) assembly 1 with an interdigital electrode structure according to Third Embodiment. FIG. 6 shows a sectional structure of the main portion thereof. The main structure of Third Embodiment is the same as that of Second Embodiment as shown in FIG. 4. Third Embodiment differs from Second Embodiment in that an ion-implanted insulating region 44 is formed in the semiconductor region between the parallel resistance wires 43.

Referring to FIG. 5, ions such as hydrogen (H), helium (He) or boron (B) ions are implanted in a narrow active layer region between the parallel resistance wires 43, which is provided in the space at each boundary portion 18 between the divided gate feed portions 11a. The insulating region 44 is formed by the ion implantation and serves as an isolating high-resistance region.

FIG. 6 shows an example of the state of such an isolating high-resistance region formed by the ion implantation. The insulating region 44 with high resistance isolates the semiconductor region between the gate feed portions 11a, which acts as an active layer, so that a leakage current can be prevented from flowing therein. Thus, the accuracy of the resistance value control can be increased with the parallel resistance wires 43.

Fourth Embodiment

Figure 7:
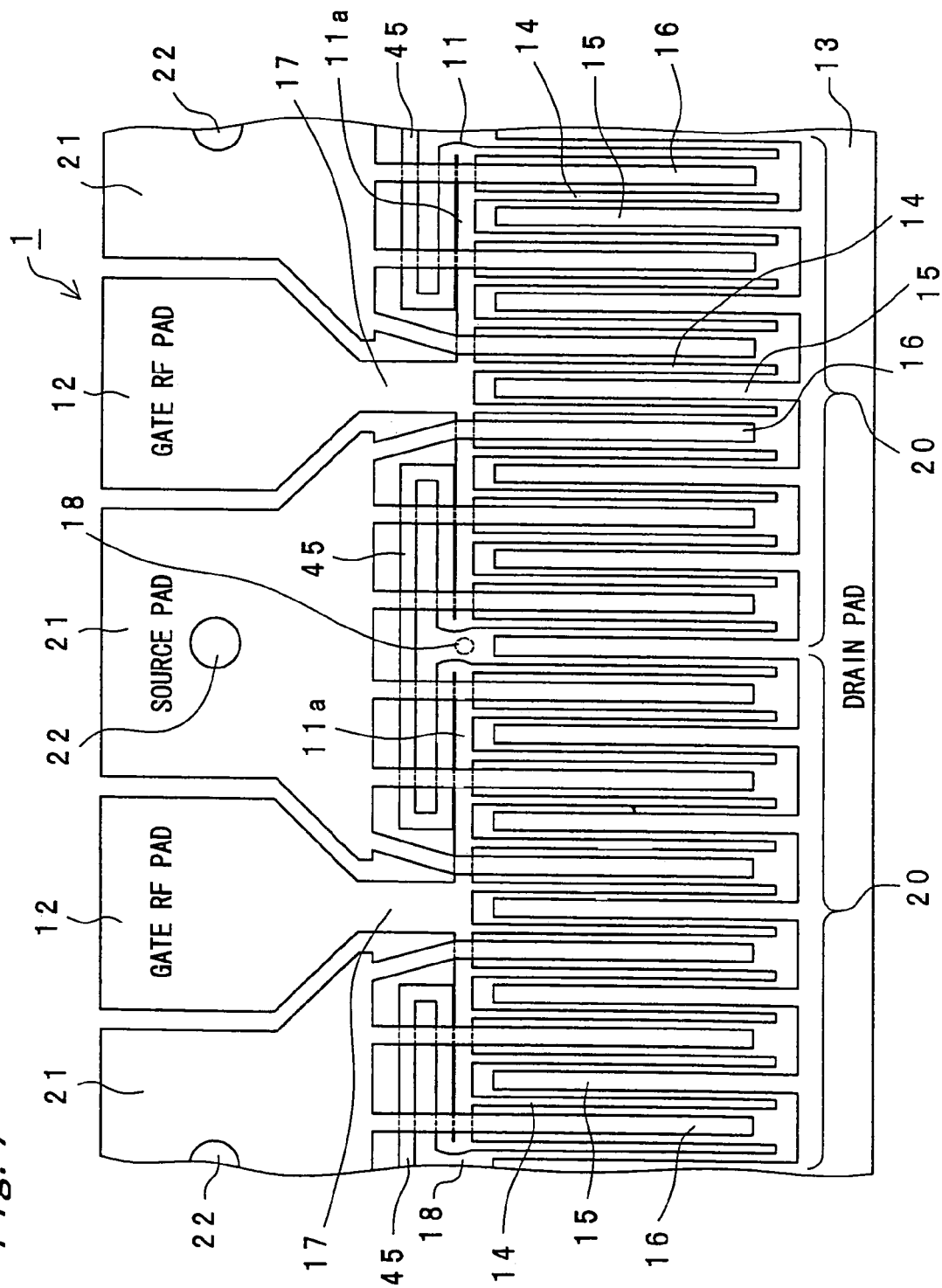
FIG. 7 is a diagram showing a main structure of a high-frequency amplifier having a transistor assembly with an interdigital electrode structure according to Fourth Embodiment of the invention.

Referring to FIG. 7, Fourth Embodiment of the invention is described below. FIG. 7 shows a schematic configuration of a field-effect transistor (FET) assembly 1 with an interdigital electrode structure according to Fourth Embodiment. The main structure of Fourth Embodiment is the same as that of First Embodiment as shown in FIG. 1. Fourth Embodiment differs from First Embodiment in that a resistance wire 45 is provided to reconnect the divided gate feed portions 11a to each other.

In the transistor assembly as shown in FIG. 7, the gate feed line 11 is extended to form the wire 45, which forms an isolation resistor circuit and reconnects the divided gate feed portions 11a to each other.

The gate feed line 11 is extended to form the resistance wire 45, which extends over each boundary portion 18 separating the gate feed 11 into divided constant-length portions. The resistance wire 45 forms an isolation resistor circuit and is placed over the gate feed portions. Both ends of each resistance wire 45 are connected to opposite ends of the adjacent gate feed portions 11a, respectively, so that the adjacent gate feed portions 11a are reconnected to each other via the resistance wire 45.

In this structure, each resistance wire 45 functions as an isolation resistor, and its resistance value can easily be changed to an optimal value by modifying the width and/or length of the resistance wire 45. The resistance wire 45, which is an extension of the gate feed portion in the transistor chip, is made of the same material and formed by the same process, as those of the gate fingers (or gate electrodes) 14, similarly to the resistance wire 19 of First Embodiment.

In the transistor assembly 1 of this embodiment, the resistance wire 45 placed in parallel to each gate feed portion forms an isolation resistor and reconnects the divided gate feed portions 11a to each other. Thus, the wire 45 has the function of suppressing the closed loop oscillation, which would otherwise be generated between a large number of transistor fingers connected in parallel. The wire 45 can suppress the odd mode oscillation between the transistors operating in parallel, and the resistance value of the resistance wire can be adjusted to an optimal value. The resistance wires provided as a circuit element within the amplifier do not increase the size of the chip.

Fifth Embodiment

Figure 8:
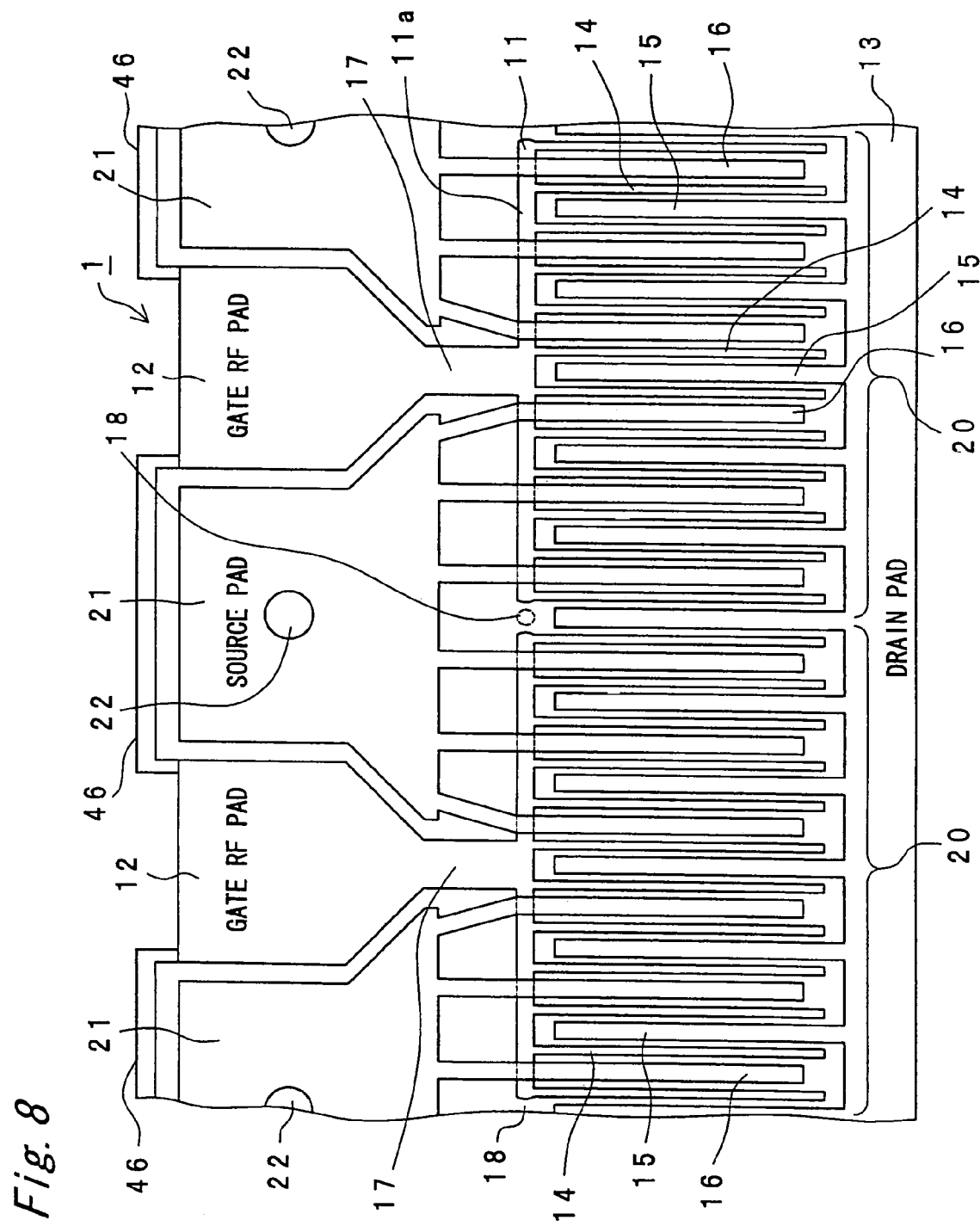
FIG. 8 is a diagram showing a main structure of a high-frequency amplifier having a transistor assembly with an interdigital electrode structure according to Fifth Embodiment of the invention.

Referring to FIG. 8, Fifth Embodiment of the invention is described below. FIG. 8 shows a schematic configuration of a field-effect transistor (FET) assembly 1 with an interdigital electrode structure according to Fifth Embodiment. The main structure of Fifth Embodiment is the same as that of First Embodiment as shown in FIG. 1. Fifth Embodiment differs from First Embodiment in that a resistance wire 46 is provided to connect the gate RF pads 12 to each other so that the divided gate feed portions 11a are indirectly connected via the resistance wire 46.

Referring to FIG. 8, each resistance wire 46 is bridged over the source pad 21 placed over each boundary portion 18 between the constant-length portions 11a divided from the gate feed 11. Each end of each resistance wire 46 is in contact with the upper end of each gate RF pad 12. Therefore, the adjacent gate feed portions 11a are indirectly connected to each other via the resistance wire 46 and the gate RF pads 12, and each resistance wire 46 functions as an isolation resistor.

Each resistance wire 46 and the gate fingers (or gate electrodes) 14 are made of the same material and formed by the same process, similarly to the resistance wire 19 of First Embodiment. The value of resistance can easily be changed by modifying the width and/or length of each resistance wire 46. Some degree of freedom is allowed for the variation of the resistance value. The resistor may be interposed not only between the adjacent gate RF pads but also between more distant gate RF pads without limitation.

In the transistor assembly 1 of this embodiment, each resistance wire 46 connected between the gate RF pads functions as an isolation resistor, which indirectly connects the divided gate feed portions 11a via the respective gate RF pads 12. Therefore, the resistance wire 46 can suppress the closed loop oscillation, which would otherwise be generated between a large number of transistor fingers connected in parallel. Thus, the same effect can be achieved as in each of First to Fourth Embodiments, and some degree of freedom is allowed for the variation of the resistance value of the interposed resistance wire.

According to the invention, a stabilizing resistor circuit is provided in the transistor chip to suppress the closed loop oscillation, and there is no need to form any external circuit for suppressing oscillation. In the gate feed region of the transistor chip according to the invention, the resistor circuit and the gate electrodes are made of the same material and formed by the same process. According to the invention, therefore, a high-frequency power amplifier can be achieved, in which the closed loop oscillation of the transistors can conveniently be suppressed with no increase in chip size.

Although the present invention has been described in connection with the preferred embodiments thereof with reference to the accompanying drawings, it is to be noted that various changes and modifications will be apparent to those skilled in the art. Such changes and modifications are to be understood as included within the scope of the present invention as defined by the appended claims, unless they depart therefrom.

What is claimed is:

1. A power amplifier comprising:
   a semiconductor substrate; and
   a plurality of field effect transistors on the semiconductor substrate and electrically connected in parallel, each field effect transistor including
   a plurality of interdigitated source, gate, and drain electrodes,
   a plurality of transistor cell elements electrically connected in parallel, each transistor cell element having
      a fixed number of the gate electrodes of the transistor,
      a gate power supply segment electrically connecting in parallel the fixed number of gate electrodes of the transistor cell element, and
      a gate power supply portion supplying a gate signal to the gate power supply segment of the transistor cell element, and
   a resistance interconnect line having a resistance and interposed between and electrically connecting respective transistor cell elements of the transistor to each other.

2. The power amplifier according to claim 1, wherein the resistance interconnect line and the gate electrodes of the transistors are the same metal material.

3. The power amplifier according to claim 1, wherein the resistance interconnect line is part of an isolation resistor circuit connected between the respective gate power supply segments of the transistors.

4. The power amplifier according to claim 1, wherein the resistance interconnect line is connected between leads of the gate power supply portions of the transistors.

5. The power amplifier according to claim 1, wherein the resistance interconnect line is interposed between opposite ends of adjacent gate power supply segments and parallel to the gate electrodes, and the opposite ends of adjacent gate power supply segments are connected via the resistance interconnect line.

6. The power amplifier according to claim 5, wherein the resistance interconnect line comprises a pair of parallel resistive interconnect lines between the opposite ends of adjacent gate power supply segments, and ends of the pair of parallel resistive interconnect lines are connected to each other.

7. The power amplifier according to claim 6, including an ion-implanted insulating high-resistance region in a region of the semiconductor substrate between the pair of the parallel resistive interconnect lines which are located between the opposite ends of adjacent gate power supply segments.

8. The power amplifier according to claim 1, wherein the resistance interconnect line interposed between the transistor cell elements comprises an extended portion of the gate power supply portion, and the gate power supply segments are connected to each other via the extended portion.

9. The power amplifier according to claim 1, wherein the resistance interconnect line interposed between the transistor cell elements connected to adjacent gate power supply portions of the transistors, and the gate power supply segments are indirectly connected to each other via the resistance interconnect line.

* * * * *